United States Patent

Sonoda et al.

[11] Patent Number: 5,936,909
[45] Date of Patent: Aug. 10, 1999

[54] STATIC RANDOM ACCESS MEMORY

[75] Inventors: Takahiro Sonoda, Fussa; Sadayuki Morita, Higashiyamato; Hirofumi Zushi, Fussa; Haruko Kawachino, Urawa; Hideharu Yahata, Chofu; Kenichi Fukui, Kodaira; Tomohiro Nagano, Akishima; Masashige Harada, Fucyu, all of Japan

[73] Assignees: Hitachi, Ltd., Tokyo, Japan; Hitachi ULSI Engineering Corp., Tokyo, Japan

[21] Appl. No.: 09/013,911

[22] Filed: Jan. 27, 1998

[30] Foreign Application Priority Data

Jan. 29, 1997 [JP] Japan ................................. 9-029719

[51] Int. Cl.$^6$ ................................. G11C 7/00
[52] U.S. Cl. .................. 365/230.03; 365/190; 365/203; 365/233; 365/236
[58] Field of Search .............................. 365/230.03, 203, 365/190, 233, 236

[56] References Cited

U.S. PATENT DOCUMENTS 4,893,278 1/1990 Ito ........................................ 365/190 X
5,150,325 9/1992 Yanagisawa et al. ............... 365/208 X Primary Examiner—Do Hyun Yoo
Attorney, Agent, or Firm—Antonelli, Terry, Stout & Kraus, LLP

[57] ABSTRACT

A static RAM has plurality of memory mats each including a plurality of static memory cells formed in a matrix pattern at points of intersection between a plurality of word lines and a plurality of data lines. upon receipt of an address signal into an address register, an address selection circuit selects a memory cell in one of the memory mats, and connects the selected memory cell to a sense amplifier or a write amplifier furnished corresponding to the memory mat in question. At the same time, an address counter generates an address signal corresponding to the address signal by which one of the memory mats has been selected. When a burst mode is designated by a control signal, the address signal admitted to the address register is used to select a memory cell in a first memory mat. The selected memory cell is connected to the corresponding sense amplifier or write amplifier. Then in accordance with the address signal generated by the address counter, a memory cell in another memory mat is selected and connected to the corresponding sense amplifier or write amplifier.

10 Claims, 9 Drawing Sheets

Y SWITCHING SCHEME

X SWITCHING SCHEME

STATIC RANDOM ACCESS MEMORY

BACKGROUND OF THE INVENTION

The present invention relates generally to a memory, and, more particularly, the invention relates to a static random access memory (RAM) utilizing techniques of burst memory access in synchronism with a clock signal.

A random access memory may comprise a memory array wherein a plurality of word lines and a plurality of data lines intersect to form a plurality of memory cells in a matrix pattern. In such a structure, selecting one word line causes a plurality of memory cells connected to that word line to be selected. The plurality of memory cells thus selected are connected respectively to a plurality of data lines. The data lines then acquire stored data from the plurality of memory cells corresponding to the selected word line. With this type of static RAM, simply switching data lines allows stored data to be retrieved consecutively from a plurality of memory cells. That is, the switching of data lines, i.e., the operation of column switches allows data to be written or read continuously to or from a plurality of memory cells in the static RAM.

SUMMARY OF THE INVENTION

With the above type of static RAM, attempts to boost the speed of successive read or write operations have been known to entail the following problem: where column switches (Y switches) are operated, they are liable to be selected in an overlapping manner. For example, if 1's are to be read after the retrieval of 0's, it is necessary to invert the potential of common data lines (i.e., making a switch from the potential representing 0 to the potential denoting 1). The inversion of the potential can take time. This means that when sense amplifiers subsequently start operating, they could amplify the preceding zero data or may fail to reach an input signal level required for sense operations. The result is a read error.

It is therefore an object of the present invention to provide a static random access memory permitting high-speed error-free consecutive access operations. Other objects, features and advantages of the invention will become more apparent upon a reading of the following description in conjunction with the appended drawings.

In carrying out the invention and according to one aspect thereof, there is provided a static semiconductor memory comprising a plurality of memory mats, a plurality of common data line pairs corresponding to the plurality of memory mats, a plurality of sense circuits connected to the common data line pairs on a one-for-one basis, and a plurality of common data line pair precharging circuits connected respectively to the common data line pairs, wherein data is output consecutively from different memory mats.

More specifically, the inventive static semiconductor memory has a plurality of memory mats each comprising a plurality of word lines, a plurality of data lines, and a plurality of static memory cells formed by the intersecting word and data lines. When an address signal is admitted to an address register, an address selection circuit selects a memory cell in one of the memory mats and connects the selected memory cell to one of the sense amplifiers or write amplifiers which corresponds to the memory mat in question. An address counter generates an address signal corresponding to the address signal that has caused the specific memory mat to be selected. When a burst mode is designated by a control signal, the address signal admitted to the address register causes a memory cell of the first memory mat to be selected and connected to the corresponding sense amplifier or write amplifier. Then, in accordance with another address signal generated by the address counter, a memory cell of another memory mat is selected and connected to the corresponding sense amplifier or write amplifier.

DESCRIPTION OF THE PREFERRED EMBODIMENTS

Figure 1:
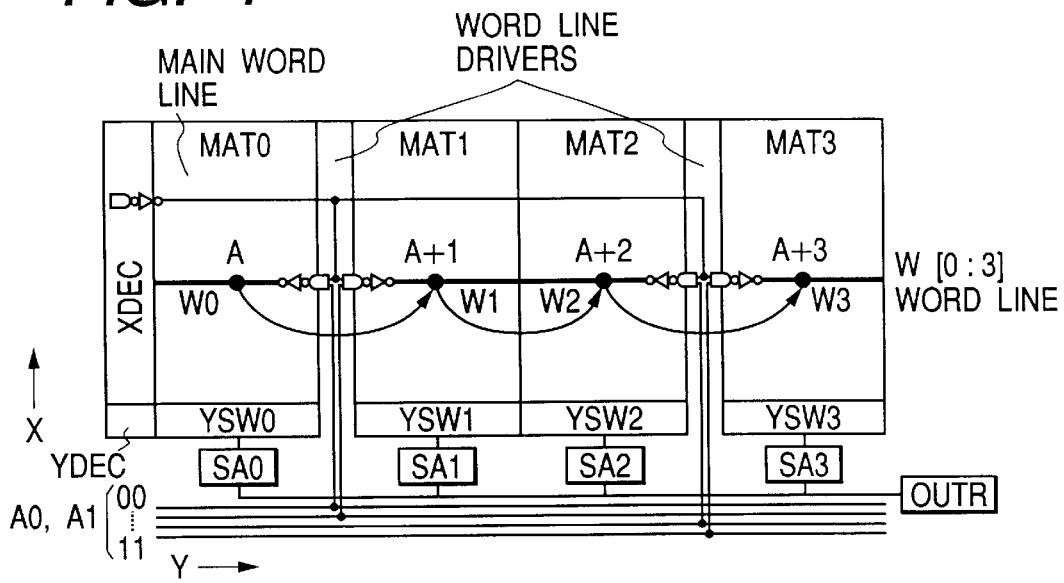
FIG. 1 is a schematic block diagram showing key components of a static RAM representing an embodiment of the invention.

FIG. 1 is a schematic block diagram showing key components of a static RAM representing one preferred embodiment of the invention. The circuit blocks in the diagram of FIG. 1 are each formed on a single semiconductor substrate by use of known semiconductor integrated circuit fabrication techniques. This embodiment has one memory array divided illustratively into four memory mats MAT0 through MAT3 whereby a burst mode of up to four cycles is implemented.

Word lines of the memory mats MAT0 through MAT3 are selected by word line drivers which receive selection signals (e.g., W0 through W3 in FIG. 1) fed from a main word line, as well as decoded signals 00 through 11 derived from address signals A0 and A1 for selecting any one of the memory mats MAT0 through MAT3. The main word line is formed by an X decoder XDEC common to the four memory mats MAT0 through MAT3. The X decoder XDEC generates a selection signal for the main word line tha t runs through the memory mats MAT0 through MAT3.

Complementary data lines of the memory mats MAT0 through MAT3 are selected by Y selection circuits (i.e., column switches) YSW0 through YSW3. When selected, the complementary data line is connected to one of the sense amplifiers SA0 through SA3 corresponding to the memory mats MAT0 through MAT3. Given a Y selection signal generated by a Y decoder YDEC, each of the Y selection circuits YSW0 through YSW3 selects the corresponding complementary data line and connects it to the corresponding sense amplifier among SA0 through SA3.

For purpose of simplification and illustration, FIG. 1 shows a read circuit alone. In this setup, one of the sense amplifiers SA0 through SA3, which corresponds to the memory mat connected to the selected word line, is activated by a sense amplifier timing signal, not shown. The activated sense amplifier sends its output signal to an output register OUTR common to the sense amplifiers SA0 through SA3.

A write circuit of the memory comprises an input register INR and write amplifiers for receiving an output signal from the input register, as illustrated in a block diagram to be described later. As with the sense amplifiers SA0 through SA3, the write amplifiers are provided in correspondence with the memory mats MAT0 through MAT3 on a one-for-one basis. As in the case of the sense amplifiers, one of the write amplifiers which corresponds to the selected memory mat is activated by a write amplifier timing signal, not shown. The activated write amplifier writes a write signal from the input register INR to the selected memory cell in the corresponding memory mat.

Selection of one of the sense amplifiers SA0 through SA3 or one of the write amplifiers entails the use of decoded signals 00 through 11 derived from the address signals A0 and A1, i.e., signals by which to generate a signal for selecting one of the memory mats MAT0 through MAT3. In practice, the sense amplifiers SA0 through SA3 are supplied with an activation timing signal, not shown, which is common to them; and the write amplifiers are supplied with signals acquired by logically processing the decoded signals. The logical processing involved and the detailed signal wiring are omitted from FIG. 1 for purpose of simplification. Where a plurality of memory cells are to be selected simultaneously from one memory mat, there should be as many sense amplifiers and write amplifiers as the number of bits involved. In that case, the memory is accessed in units of multiple bits.

Figure 2:
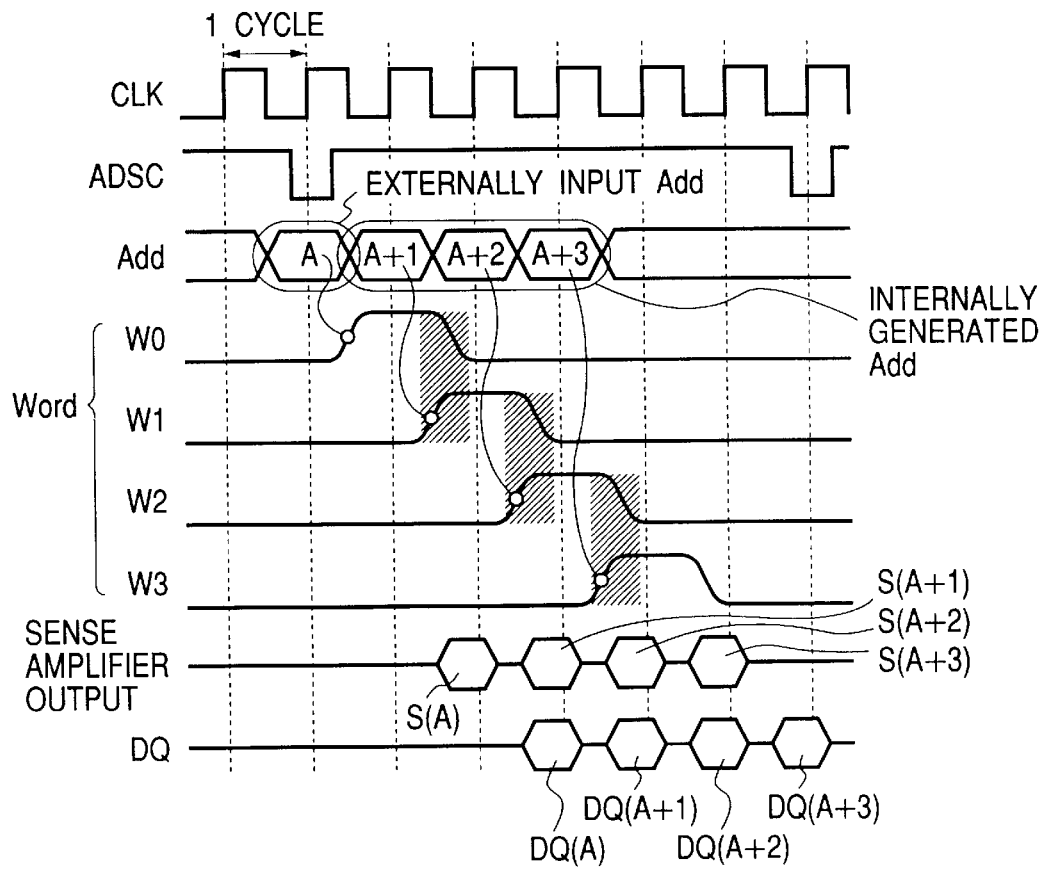
FIG. 2 is a timing chart indicating how a burst read operation of the static RAM is performed.

FIG. 2 is a timing chart indicating how a burst read operation of the inventive static RAM is performed. This static RAM operates in synchronism with a clock signal CLK, as will be described later. An address counter, to be described later, is provided to implement burst operations. The address counter generates address signals for use from the second cycle on.

burst read mode is designated when a chip select signal, a write enable signal, and a control signal ADSC or the like, not shown, is brought Low. In the burst read mode, an external address signal A is admitted in synchronism with the clock signal CLK receives at this point. With the address signal A decoded, the word line W0 of the first memory mat MAT0 is selected accordingly. The word line W0 is driven High upon elapse of a decoding interval of the address signal A. The word line W0 remains selected for the next cycle of the clock signal CLK.

In the above setup, stored data is read from the memory cell onto the complementary data line of the memory mat MAT0. From the complementary data line, the read data is sent to the input of the sense amplifier SA0 through the Y selection circuit YSW0. Because it takes time for stored data of a memory cell to reach the sense amplifier input, the sense amplifier SA0 is activated one clock cycle after the selection of the word line W0. Thus activated, the sense amplifier SA0 generates an output signal S(A). The signal S(A) is delayed by anoth er clock cycle before being sent to the output register 0UTR. From there, the signal is output as a read signal DQ(A).

In parallel with the selection of the word line W0 and in synchronism with a second clock signal CLK, the address counter counts up the address signal to generate an internal address signal A+1. Then in synchronism with a third clock signal CLK, the address selection circuit selects the word line W1 of the memory mat MAT1 in place of the word line W0 of the memory mat MAT0. In like manner, the word lines W2 and W3 of the memory mats MAT2 and MAT3 are selected consecutively. The sense amplifiers SA1, SA2 and SA3 are each activated one clock cycle after the selection of the corresponding word line. When activated, the sense amplifiers output signals DQ(A+1), DQ(A+2) and DQ(A+3) successively, each signal being output one clock cycle after activation of the corresponding amplifier. In total, six cycles of the clock signal CLK are expended to implement a four-cycle burst read operation. In the seventh cycle, the signal ADSC is brought Low for the next burst read operation.

In the above embodiment, a switch from the word line W0 to word line W1, from the word line W1 to word line W2, or from the word line W2 to word line W3 entails a state in which a plurality of word lines remain selected, as shown as shaded areas in FIG. 2. However, the fact that the word lines W0 through W3 are connected separately to the different memory mats MAT0 through MAT3 prevents any multiple memory cells from being selected simultaneously. Since the sense amplifiers SA0 through SA3 are provided in correspondence with to the memory mats MAT0 through MAT3 on a one-for-one basis, there occurs no signal contention therebetween.

Figure 3A:
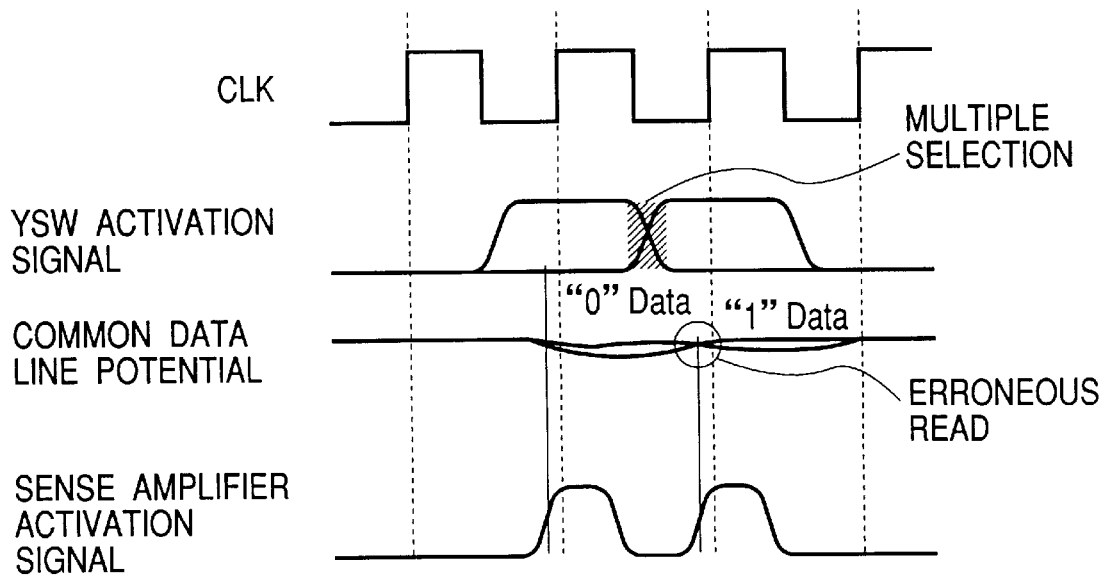
FIGS. 3A and 3B are timing charts depicting how burst operations of the static RAM are carried out.
Figure 3B:
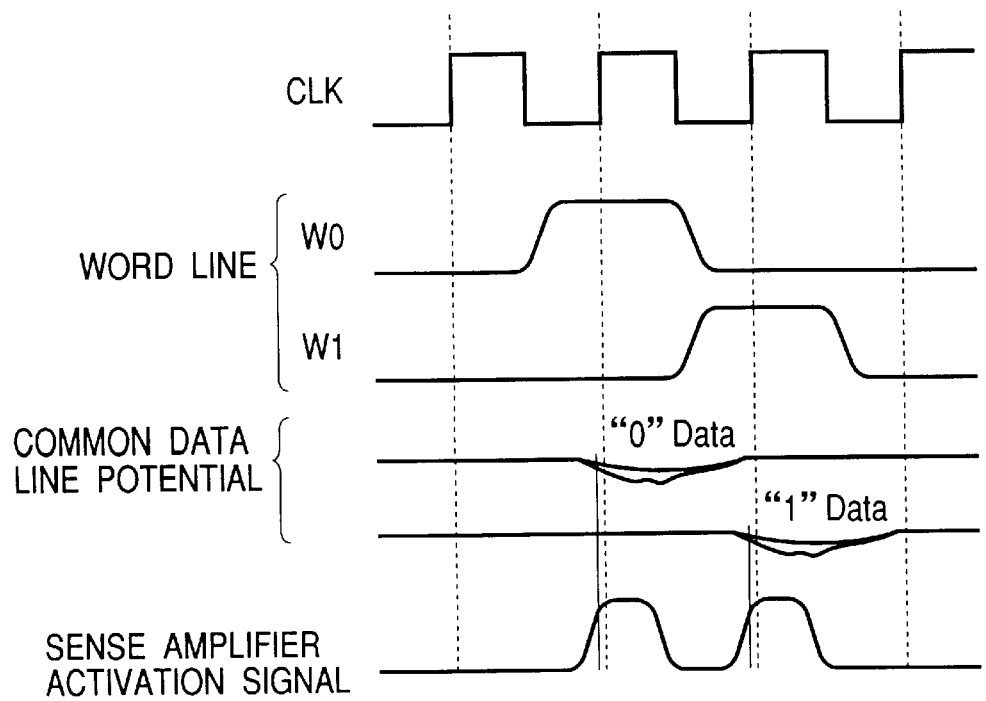

FIGS. 3A and 3B are timing charts depicting how burst operations of the static RAM are carried out. The two figures depict two switching schemes comparatively to facilitate the understanding of this invention. FIG. 3A shows a conventional Y switching scheme whereby, with one word line selected, Y selection circuits are switched. FIG. 3B depicts an X switching scheme of the invention whereby memory mats are switched.

Under the scheme of FIG. 3A, a word line is selected, and a Y selection circuit activation signal YSW is switched in the same cycle of the clock signal CLK. This inevitably results in a double selection state involving two column switches, one being switched from a selected to a nonselected state as shown by the shaded are in FIG. 3A, the other column switch being switched from a nonselected to a selected state. A read signal from the complementary data line selected by the Y selection circuit (column switch) is placed onto a common data line. On the common data line, if the current read signal of 0 ("0" data) is followed by the next read signal of 1 ("1" data), the time at which the signal is inverted is delayed. That is, the signal level in effect when the sense amplifier is activated is not yet sufficient. The result is a read error. For this reason, attempts to carry out pipeline operations in synchronism with the clock signal CLK under the Y switching scheme impede the switching of Y selection circuits within one clock cycle. Hence, the delay of burst operations results.

By contrast, under the X switching scheme of FIG. 3B, by allowing memory mats to be switched, a double selection of the word lines W0 and W1 upon switchover therebetween signifies that the word lines of two different memory mats MAT0 and MAT0 are selected in duplicate, which does not pose problems in terms of word line switchover. Because the Y selection circuits and sense amplifiers are isolated electrically from one another and are furnished in correspondence with the memory mats MAT0 and MAT1 on a one-for-one basis, there is no contention between read data. From the sense amplifiers SA0 and SA1 with their common data, lines precharged, read data, such as "0" and "1" data, are obtained. The data can be retrieved correctly by use of the sense amplifier activation signal issued upon selection of the memory mats MAT0 and MAT1.

Figure 4:
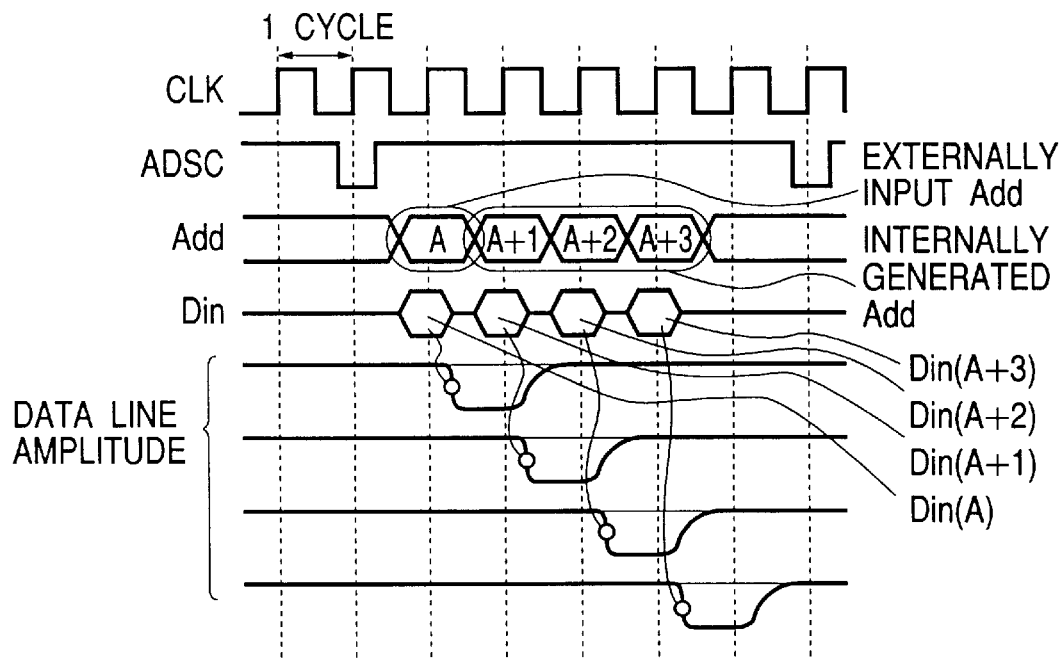
FIG. 4 is a timing chart illustrating how a burst write operation of the static RAM is executed.

FIG. 4 is a timing chart illustrating how a burst write operation of the inventive static RAM is executed. A burst write mode is designated when the chip select signal, write enable signal, and control signal ADSC or the like, not shown, is brought Low. In the burst write mode, the external address signal A and a write signal Din(A) are admitted in synchronism with the clock signal CLK received at this point. Although not shown in FIG. 4, the address signal A is decoded in the same manner as in the case of the burst read operation, and the word line W0 of the first memory mat MAT0 is selected accordingly. The word line W0 is driven High upon elapse of a decoding interval of the address signal A. The word line W0 remains selected for the next clock signal CLK. The write signal Din(A), admitted to the input register INR tobe described later, is placed onto the complementary data line of the memory mat MAT0 upon selection of the word line W0 and in synchronism with the next clock signal CLK. From the complementary data line, the write signal is written to the selected memory cell.

In parallel with the selection of the word line W0 and in synchronism with a second clock signal CLK, the address counter counts up the address signal to generate an internal address signal A+1. The write signal Din(A+1) is input in synchronism with the next clock signal CLK and is admitted to the input register INR. Then, in synchronism with a third clock signal CLK, the address selection circuit selects the word line W1 of the memory mat MAT1 in place of the word line W0 of the memory mat MAT0.

In like manner, the word lines W2 and W3 of the memory mats MAT2 and MAT3 are selected consecutively. The write signals Din(A+1), Din(A+2) and Din(A+3) are admitted consecutively to the input register INR in synchronism with the respective word lines being selected successively. From the input register INR, the write signals are placed onto the complementary data lines of the memory mats MAT1, MAT2 and MAT3 synchronously with the selection of the word lines W1, W2 and W3. From the complementary word line, each write signal is written to the selected memory cell. In the last memory mat MAT3, it takes one cycle to recover (i.e., precharge) the write signal on the complementary data line. In total, six cycles of the clock signal CLK are expended to implement a four-cycle burst write operation. In the seventh cycle, the signal ADSC is brought Low for the next burst read operation. As described, both the burst read operation and the burst write operation with a burst length of four cycles each may be implemented through the use of six cycles of the clock signal CLK.

Figure 5:
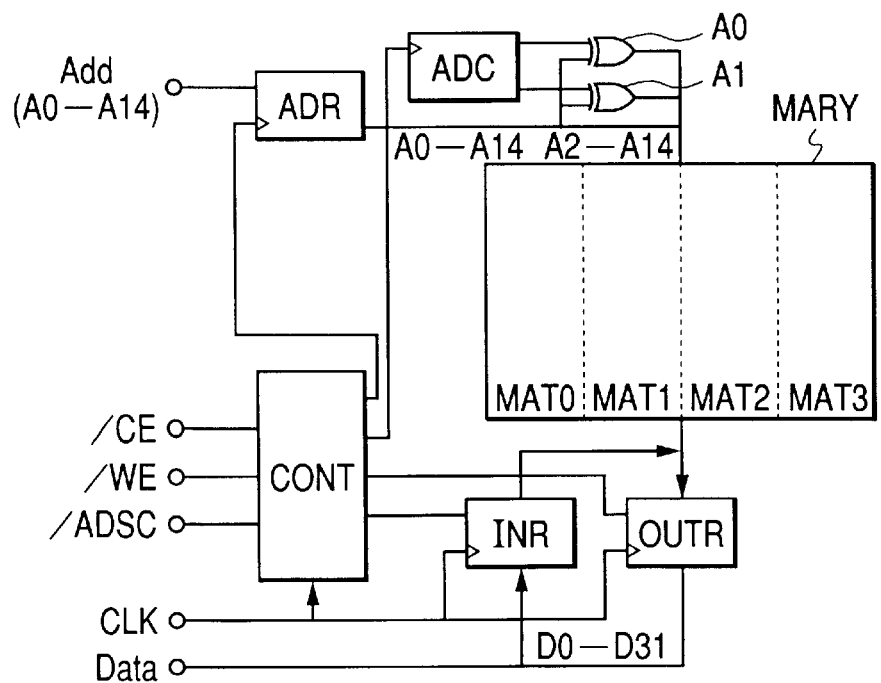
FIG. 5 is an overall block diagram of the static RAM embodying the invention.

FIG. 5 is an overall block diagram of the static RAM embodying the invention. The circuit blocks in the diagram of FIG. 5 are formed on a single semiconductor substrate composed illustratively of single crystal silicon by use of known semiconductor integrated circuit fabrication techniques. In FIG. 5, it should be understood that the memory array MARY comprises peripheral circuits, such as address selection circuits (X and Y decoders), sense amplifiers SA0 through SA3 andwrite amplifiers, inaddition to the memorymats MAT0 through MAT3.

An address terminal Add admits illustratively 15-bit address signals such as A0 through A14. These address signals are input to an address register ADR. Of the address signals A0 through A14 placed into the address register ADR, the address signals A0 and A1 are used to generate a signal for selecting any one of the memory mats MAT0 through MAT4; and the other address signals A2 through A14 are supplied to the address selection circuits of the memory array MARY. The two address signals A0 and A1 are fed to one of the inputs of an adder circuit illustratively made up of exclusive-OR circuits. The other input of the adder circuit is fed with two-bit address signals generated by the address counter ADC. Output signals from the adder circuit are sent as signals A0 and A1 to the memory array.

Each of the memory mats MAT0 through MAT3 in the memory array MARY is accessed illustratively in units of 32 bits. That is, the address selection circuits select 32 memory cells simultaneously so that 32 memory bits are accessed in one block. This setup presupposes that the input register INR and output register OUTR are each composed of 32 bits and that a data terminal "Data" is made up of 32 signal lines carrying signals D0 through D38 for input or output.

A control circuit CONT receives illustratively a chip select signal /CE, a write enable signal /WE, a burst control signal /ADSC and a clock signal CLK, determines an appropriate operation mode, and generates timing signals in accordance with the selected operation mode. When the burst mode is designated, the address counter ADC is supplied with count pulses in synchronism with the clock signal and counts up the address signal as described above.

The address register ADR is placed into a chip select state illustratively by the chip select signal. In the chip select state, the address register ADR is fed with the clock signal CLK so as to admit the external address signal Add. The clock signal CLK is supplied to the input register INR and output register OUTR. When a read mode is designated by the control circuit CONT, the output register OUTR is activated; is when a write mode is designated, the input register INR is activated. When activated, each register operates in synchronism with the clock signal CLK.

The burst length may be fixed or may be set variably by acontrol signal. The address counter ADC is reset as illustrated when placed in the chip select state. Thus, when the burst mode is not designated, the address counter ADC outputs 00. This causes the output of the adder circuit to become equivalent to the address signals A0 and A1 out of the signals A0 through A14 fed to the address terminal Add. Eventually, the adder circuit output is admitted to the address register ADR to become the same as the external address signal. In this manner, where the signals A0 and A1 formed by the adder circuit are used to select the memory array MARY, there is no problem with read or write operations other than in the burst mode.

Figure 6:
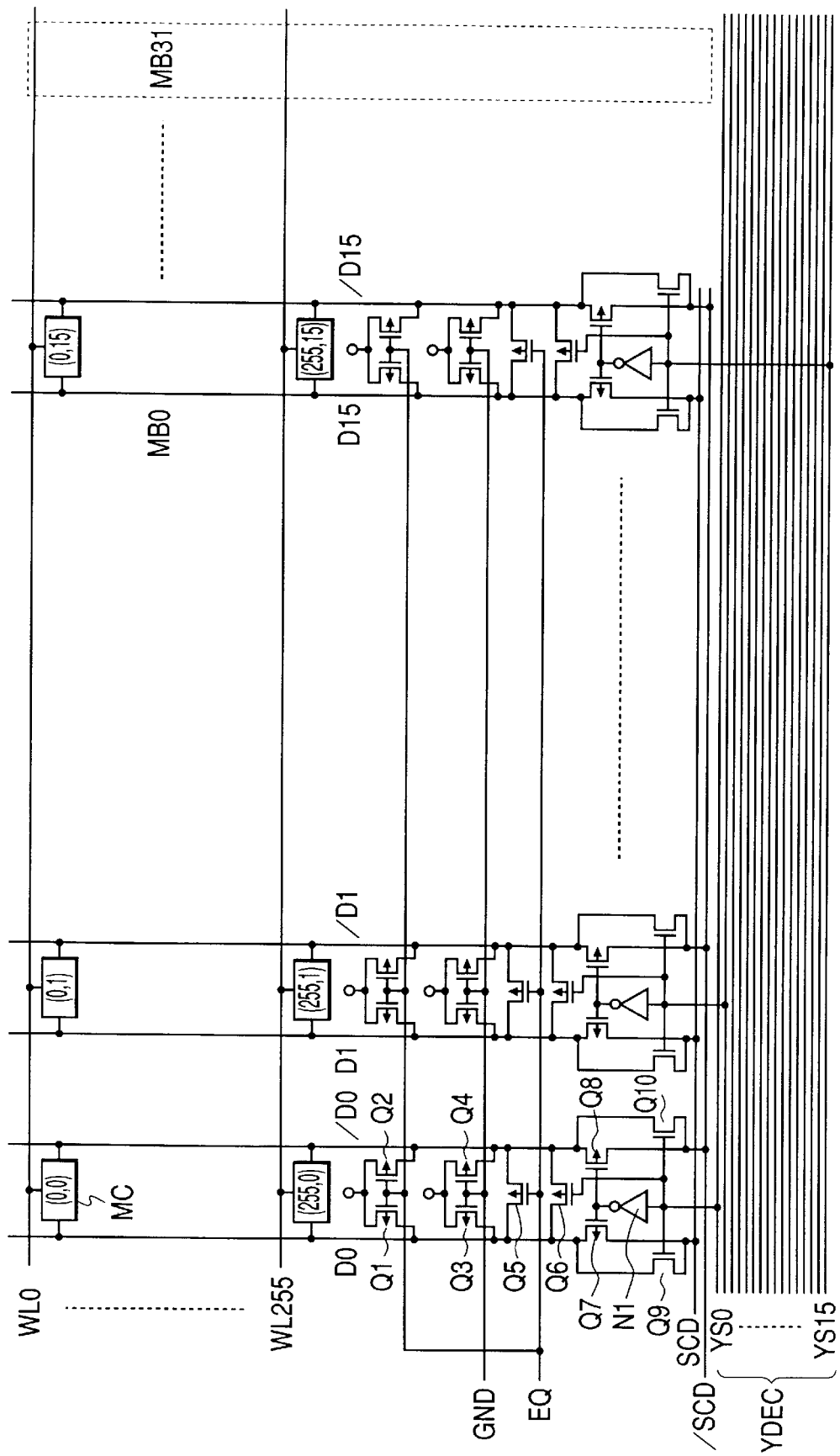
FIG. 6 is a circuit diagram of one memory mat in the static RAM embodying the invention.

FIG. 6 is a circuit diagram of one memory mat in the static RAM embodying the invention. The memory mat of FIG. 6 illustratively comprises three pairs of complementary data lines D1–/D1, D2–/D2, and D15–/D15, as well as four word lines WL0 through WL255. In FIG. 6, a P-channel M0SFET has its back gate (channel part) shown arrowed in distinction from an N-channel MOSFET. A symbol / (slash) represents an over-bar, i.e., a logical symbol indicating the Low level as the active level. The same also applies to the setup in FIG. 5.

Memory cells are shown as black boxes at points of intersection between the word lines and the complementary data lines. Numerals in each black box indicate an x and a Y address. Although not shown, each memory cell comprises a CMOS latch circuit and an N-channel M0SFET. The CMOS latch circuit has a pair of CMOS inverter circuits each composed of a P-channel and an N-channel MOSFET. The inputs and outputs of the CMOS inverter circuits are connected in an alternately crossed manner. The N-channel MOSFET in each memory cell is used for address selection and is located interposingly between the I/O node and the data line of the latch circuit. The P-channel MOSFET constituting part of the CMOS inverter circuits may be replaced by a polysilicon resistor having a high resistance value.

The complementary data lines D0-/D0 have P-channel MOSFETs Q3 and Q4 which act as pull-up resistors when their gates are fed continuously with a circuit groundpotential GND. The sources of these P-channel MOSFETs Q3 and Q4 are connected to a supply voltage, which causes the complementary data lines D0-/D0 to be pulled up on the supply voltage side. The P-channel MOSFETs Q3 and Q4 serving as pull-up resistors have an elevated ON-state resistance value so as to permit the flow of only a small current. The arrangement thus lowers power dissipation upon selection of the memory cell and, in a write operation, reduces loads on write amplifiers. This speeds up potential changes on the complementary data line D0 or /D0 that is driven Low (i.e., circuit ground potential) corresponding to the write signal.

The complementary data lines D0-/D0 have P-channel MOSFETs Q1 and Q2 as loads on read operations. The P-channel MOSFETs Q1 and Q2 are turned on by an equalizing signal EQ except when a substantial write operation is carried out, the activated MOSFETs acting as loads on the complementary data lines D0-/D0. A P-channel MOSFET Q5 installed interposingly between the complementary data lines D0-/D0 serves as a short-circuiting MOSFET at the time of write recovery. In the read operation, such as that described above, the P-channel MOSFET Q5 acts as a read signal level limiter.

When the memory cell selected by a word line selecting operation is connected to the complementary data lines D0-/D0, the Low read level is determined by a conductance ratio in effect between the ON-state N-channel MOSFET and an N-channel transmission gate MOSFET constituting the latch circuit in the memory on the one hand, and the load resistance of the P-channel MOSFET on the other hand. At this point, a relatively high conductance set for the load MOSFET causes the Low read level to become relatively high, i.e., close to the supply voltage VCC. When the Low level tends to drop below the threshold voltage of the short-circuiting MOSFET, the short-circuiting MOSFET is turned on to limit the Low level.

A column switch is composed of what is known as a CMOS switching circuit having P-channel MOSFETs Q7 and Q8 and N-channel MOSFETs Q9 and Q10 connected in a parallelly interposingmanner between the complementary data lines D0-/D0 on the one hand and the common data lines SCD-/SCD on the other hand. A Y selection line YS0 receiving a selection signal from the Y decoder YDEC is connected to the gates of the N-channel MOSFETs Q9 and Q10 furnished on the complementary data lines D0-/D0. The Y selection line YS0 is also connected to the input of an inverter circuit N1. The output terminal of the inverter circuit N1 is connected to the gates of the P-channel MOSFETs Q7 and Q8 furnished on the complementary data lines D0-/D0. In this setup, bringing the Y selection line YS0 High turns on the N-channel MOSFETs Q9 and Q10 and the P-channel MOSFETs Q7 and Q8 simultaneously.

One memory mat is provided with a total of 16 pairs of complementary data lines D0-/D0 through D15-/D15 which are in turn connected to a total of 16 Y selection lines YS0 through YS15. The Y selection lines YS0 through YS15 "transfix" a total of 32 memory blocks ranging from a memory block MB0 shown in FIG. 6 to a memory block MB31 indicated by a broken line in the figure. These Y selection lines need not be a single continuous physical line each. In view of the fact that loads onthe Y selection lines are considerable and that column switch selecting operations tend to be slow because of signals delays over extensive lines, the Y selection lines may be divided into blocks each furnished with a driver.

The common data lines SCD-/SCD are connected to a sense amplifier input terminal and a write amplifier, not shown. Where there are 32 memory blocks MB0 through MB31 as described above, there exist 32 pairs of common data lines SCD-/SCD each provided with a sense amplifier and a write amplifier. The above four memory mats MAT0 through MAT3 are each composed of the memory blocks shown in FIG. 6. When there are four memory mats MAT0 through MAT3 as in this embodiment, wherein their word lines are switched for a burst read or a burst write operation, no word lines are selected in duplicate within the same memory mat. This prevents any contention of read or write data on the common data lines.

That is, each operation cycle and the next cycle are utilized in a more effective manner than before. In the burst read mode, for example, the current operation cycle and the next cycle are used effectively to select the word line, to select the sense amplifier, and to transmit the sense amplifier output to the output register. The use of two clock cycles affords enough time for word line selection and data line recovery following the write operation. Because there occurs no duplicate selection of Y selection circuits within the same memory mats, the common data lines always enter a precharged potential state before being selected. Upon sense amplifier activation, the inverse data will not be amplified. This enhances the operating margins of the sense amplifiers. These arrangements make it possible to have a clock signal CLK with a frequency of 200 MHz or higher.

The high-speed performance made available as described allows the embodiment to act illustratively as a cache memory. The static RAM of FIG. 5 may serve as a cache data memory. Generally, the cache memory is divided into three major portions: a cache tag (address array), a cache data memory, and a cache controller. A typical cache data memory will be described later. The cache tag stores an address part called an address tag, and the cache data memory accommodates data corresponding to the address tag held in the cache tag.

When the address part in the cache tag coincides with an address from the CPU, the cache tag outputs a hit signal. This causes the data in the parallelly selected cache data memory to be retrieved therefrom and admitted to the CPU. In case of no coincidence between the cache tag and the address from the CPU (i.e., miss), the main memory will be accessed. Where the burst mode is provided, the CPU may read or write 32 bits of data consecutively in synchronism with the clock signal CLK. In the event of a miss, the above arrangement also allows data to be transferred at high speed between the main memory and the cache data memory.

Figure 10:
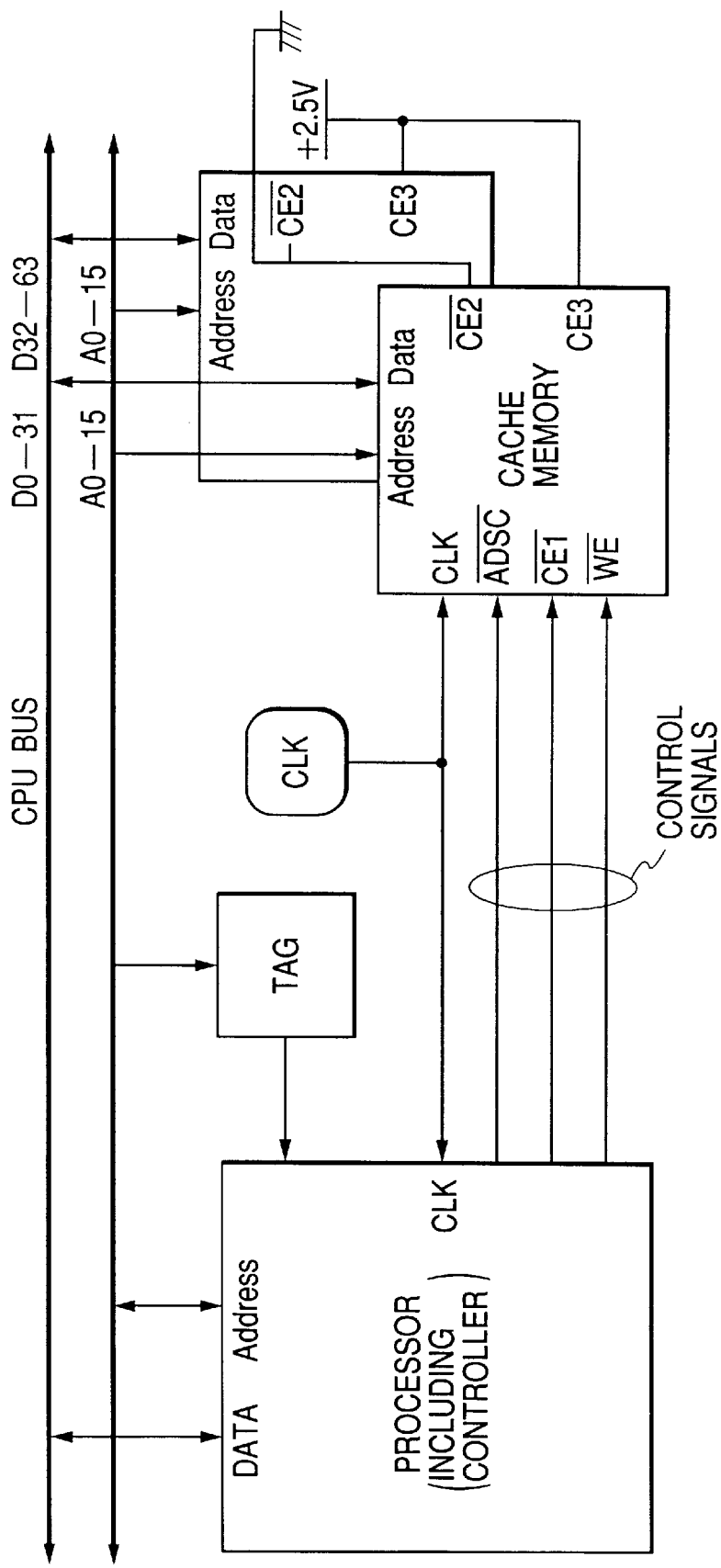
FIG. 10 is a block diagram of a computer system that utilizes a static RAM as a cache memory.

FIG. 10 is a block diagram of a typical computer system. In FIG. 10, the processor (i.e, CPU) incorporates a controller for cache memory control, a primary cache memory, and a processor core. In the event of a miss in the primary cache memory, the processor attempts to access externally located data. External data access operations are implemented by the processor having a data terminal DATA connected to an external CPU bus and an address terminal "Address" connected to an external address bus. In FIG. 10, a component named TAG represents a cache tag. An address on the external address bus is compared with the tag in the cache tag, and the result of the comparison is reported to the processor. In case of a hit, the data in the cache memory is admitted to the primary cache memory inside the processor. In the event of a miss, the main memory is accessed. In the setup of FIG. 10, the cache memory component illustratively denotes a secondary cache memory arrangement that has a data terminal "Data" connected to the external data bus and an address terminal connected to the external address bus. For the processor of this example, the data bus size is 64 bits, and there are two secondary cache memories each accessed in units of 32 bits. The processor supplies the secondary cache memories with the same address signals A0 through A15. In FIG. 10, the cache memory in the foreground has its data terminal connected to half of the 64-bit external bus, i.e., to bus lines D0 through D31; and the cache memory in the background has its data terminal connected to the remaining half of the 64-it external bus, i.e., to bus lines D32 through D63. In addition, the cache memories have three chip enable terminals /CE1, /CE2 and CE3 each. Of the three chip enable terminals, the terminals /CE2 and CE3 are fed with an appropriate supply voltage and circuit ground potential to keep the cache memories continuously active.

The two cache memories are each supplied with a clock signal generated by a clock signal generator CLK. The clock signal is generated so as to keep the processor and cache memories operating in synchronism. The processor generates control signals /ADSC, /CE1 and /WE and feeds the generated signals to the cache memories for control thereof. The control signals /ADSC, /CE1 and /WE correspond respectively to the signals /ADSC, /CE and /WE in FIG. 5.

Figure 7:
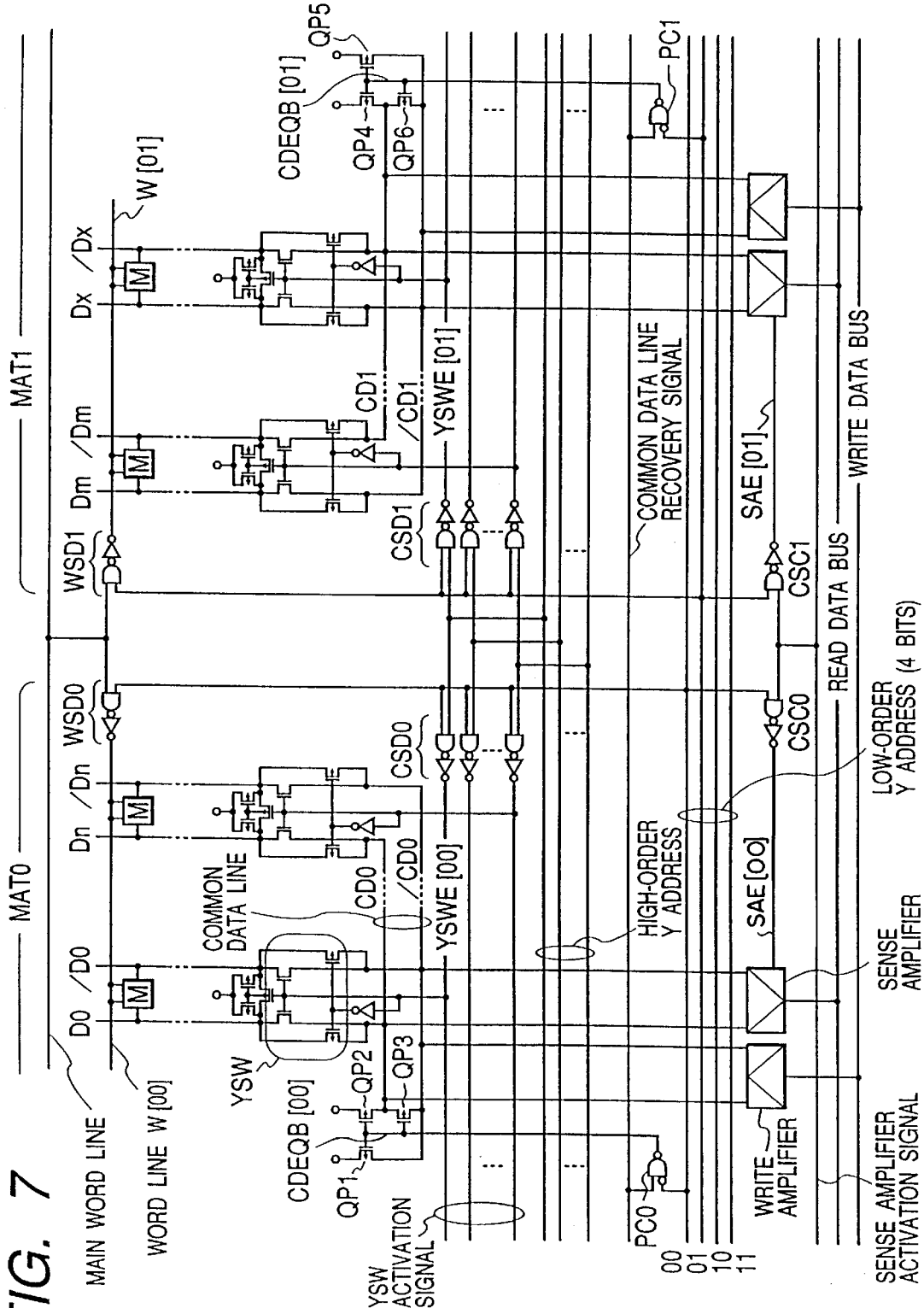
FIG. 7 is an overall circuit diagram of another static RAM embodying the invention.

A static memory embodying the invention and used as a cache memory will now be described. The static memory, as with the embodiment shown in FIG. 1, has four memory mats. FIG. 7 is a circuit diagram of the static memory comprising two memory mats.

In FIG. 7, data lines are represented by D0, /D0, Dn, /Dn, Dm, /Dm, Dx and /Dx. Illustratively, a pair of complementary data lines are formed by the lines D0-/D0. Each static memory cell M has its input/output terminals connected to the corresponding complementary data line pair and has its selection terminal connected to the word line. The word line in the memory mat MAT0 is selected and driven by a word line selection circuit WSD0 that receives a selection signal from themainword line andamemorymat selection signal (00). Each word line selection circuit of this embodiment comprises a two-input NAND circuit admitting the above selection signals and an inverter which receives the NAND circuit output and places a signal accordingly onto the word line.

The complementary data line pairs are connected via a column switch arrangement to the common data line pairs. The column switch arrangement may be regarded as consisting of a plurality of unit column switches YSW. Each unit column switch has the same structure as that of the column switch depicted in FIG. 6 and thus will not be described further. The common data line pair CD0-/CD0 is furnishedwith a precharging circuit. The precharging circuit is composed of P-channel MOSFETs QP1 and QP2 connected interposingly between the supply voltage node and the common data lines, and of a P-channel MOSFET QP3 for equalizing the common data line pairs. Driving a common data line precharging signal CDEQB[00] Low precharges and equalizes the common data line pairs. The common data line precharging signal CDEQB [00] is generated by a precharging control circuit PC0. The precharging control circuit PC0 has a NAND circuit that receives two signals, i.e., an inverted signal derived from the memory mat selection signal (00) assigned to the memory mat in question, and a common data line recovery signal. The precharging control circuit PC0 generates a Low-level common data line precharging signal CDEQB [00] when the assigned memory mat selection signal (00) denotes nonselection of the mat and when the recovery signal designates precharging of the common data lines.

The unit column switches constituting the column switch arrangement are each supplied with an activation signal from a column switch selection circuit CSD0. The column switch selection circuit receives a high-order address part of the column address (Y address) and the memory mat signal (00) assigned to the memory mat in question. When the memory mat is selected, one of the unit column switches making up the column switch arrangement is selected and made to conduct.

Each common data line pair is connected to the input terminal of the corresponding sense amplifier. When a sense amplifier timing signal SAE[00] is driven High, the difference in potential between the paired common data lines is judged and the result of the judgment is placed onto the read data bus. The sense amplifier timing signal SAE[00] is generated by a sense amplifier control circuit CSC0 that receives the memory mat selection signal (00) assigned to the memory mat in question and a sense amplifier activation signal. Each sense amplifier is constituted illustratively by two inverter circuits connected in an alternately crossed manner, the I/O terminals of the inverter circuits being connected to common data lines so that the positive feedback action of the inverter circuits amplifies a potential difference between the common data lines. This type of sense amplifier, when in operation, extends the potential difference between the common data lines.

In terms of datawrite operations, this embodiment differs from the preceding embodiment. Specifically, write data is supplied over a bus isolated from the read data bus. The write data is input to a write amplifier corresponding to the memory mat in question. From the write amplifier, complementary data derived from the write data is fed to the common data line pair.

Although the description above has centered on the memory mat MAT0, the same also holds for the other memory mats such as MAT1 having the same structure as the memory mat MAT0. Whereas the memorymat MAT0 is assigned the memorymat selection signal (00), the other memory mats such as MAT1 are assigned other memory mat selection signals (e.g., 01 to MAT 1).

As will be understood from FIG. 7, each memory mat is furnished, ona one-for-one basis, with a common data line pair (e.g., CD-/CD), a common data line precharging circuit, a sense amplifier and a write amplifier. From another point of view, the memory mats are each constituted by memory cells connected via column switches to one or a pair of common data lines. In this setup, the memory cells connected to different common lines via the column switches may be regarded as belonging to different memory mats.

How this embodiment works will now be described with reference to the operation waveform charts in FIGS. 8A and 8B.

Figure 8A:
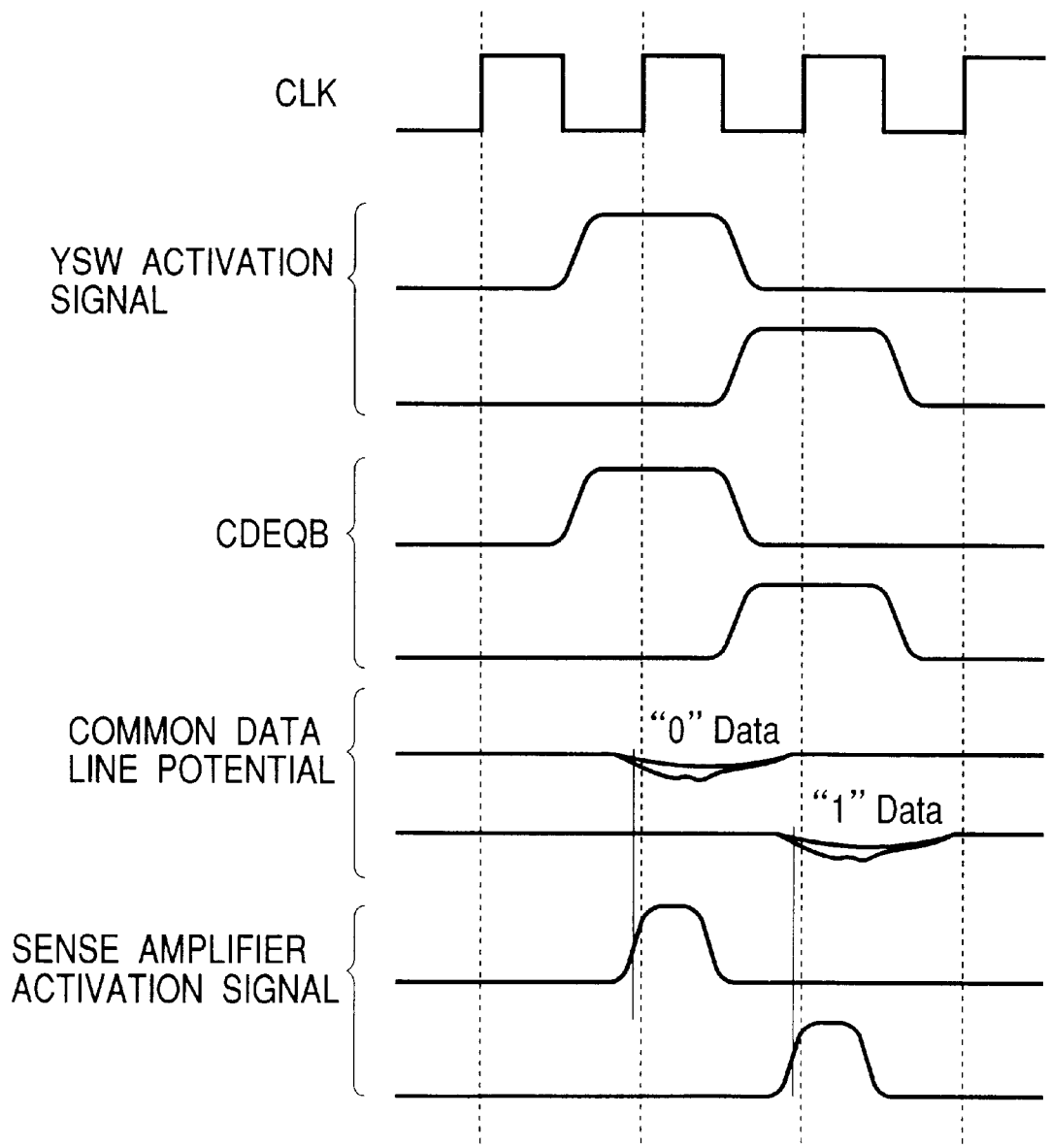
FIGS. 8A and 8B are waveform charts depicting how read operations are carried out.

As shown in FIG. 8A, the column switch activation signal for, say, the memory mat MAT0 is brought High from Low in accordance with the clock signal CLK. Likewise, the common data line precharging signal CDEQB for the memory mat MAT0 is driven High from Low. Bringing the common data line precharging signal CDEQB High terminates the precharging of the common data lines CD0-/CD0; while driving the column switch activation signal High causes the memory cell data to be placed onto the common data lines CD0-/CD0. During the process, the potential of the common data lines CD0-/CD0 varies as shown in FIG. 8A. Thereafter, bringing the sense amplifier activation signal High illustratively amplifies the potential difference between the common data lines. With the burst read mode in effect, the column switch activation signal for the memory mat MAT1 is then driven High from Low. At the same time, the common data line precharging signal CDEQB for the memory mat MAT1 is driven High from Low. Bringing the common data line precharging signal CDEQB High terminates the precharging of the common data lines CD1-/CD1. Driving the column switch activation signal High causes the memory cell data to be placed onto the common data lines CD1-/CD1. During the process, the potential of the common data lines CD1-/CD1 varies as depicted in FIG. 8A As will be understood from FIG. 8A, while data is being read from one memory mat, the common data lines for another memory mat may be precharged. Generally, the common data lines are connected to a relatively large number of transistors involving comparatively long wiring, with the result that the parasitic capacity connected to the common data lines tend to be relatively large. The greater the parasitic capacity, the longer it takes to precharge the common lines connected to that capacity. With this embodiment, by contrast, the common data lines of a given memory mat may be precharged while data is being read from another memory mat. If the common data lines are shared by a plurality of memory mats, the time allowed for precharging each line is necessarily shorter. Where the common data lines are lowered in potential in keeping with the previously read data, the potential level needs to be restored by precharging. It can happen, however, that the next data is transmitted via the column switch to the common data lines before the potential level is restored, which results in an error. With this embodiment, the common data lines are separated, and consecutive read operations are carried out across different memory mats. This forestalls the above kind of error.

Figure 8B:
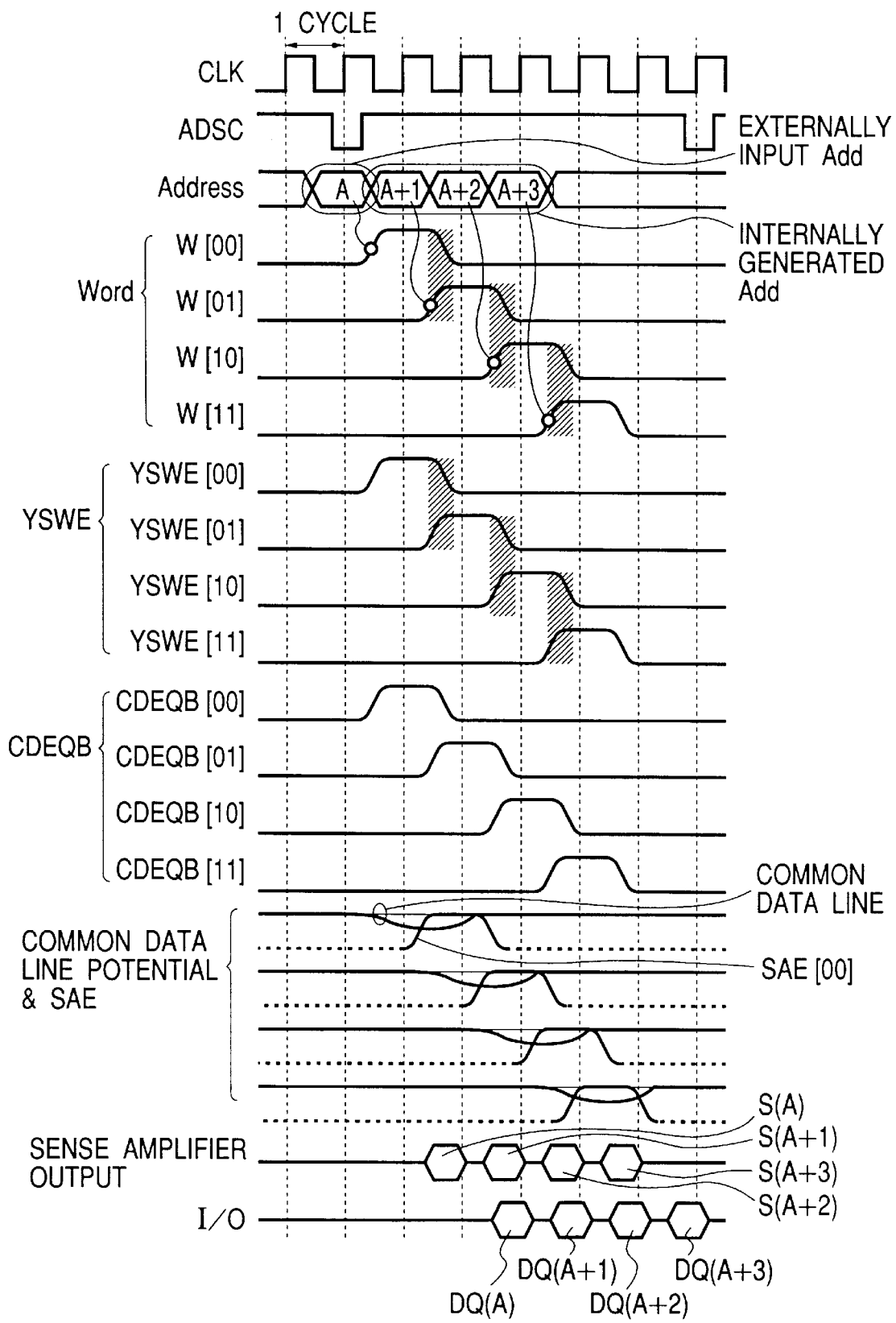

FIG. 8B illustrates waveforms in effect in the burst read mode. The waveform chart of FIG. 8B is similar to that of FIG. 2. The operation workings represented by this waveform chart will be readily understood from a reading of both the waveform chart of FIG. 2 and that of FIG. 8A. Thus what is represented by FIG. 8B will not be described further in detail. Even if the column switch selection signals YSWE [00], YSWE[01], YSWE[10] and YSWE[11] are all selected simultaneously as indicated in FIG. 8B, no problem is expected because the common data lines are separated from one another; and the line separation prevents the previously selected common data lines still carrying data from affecting the currently selected common data lines. Furthermore, there is no problem with a plurality of common data lines being precharged in an overlapping manner.

Figure 9:
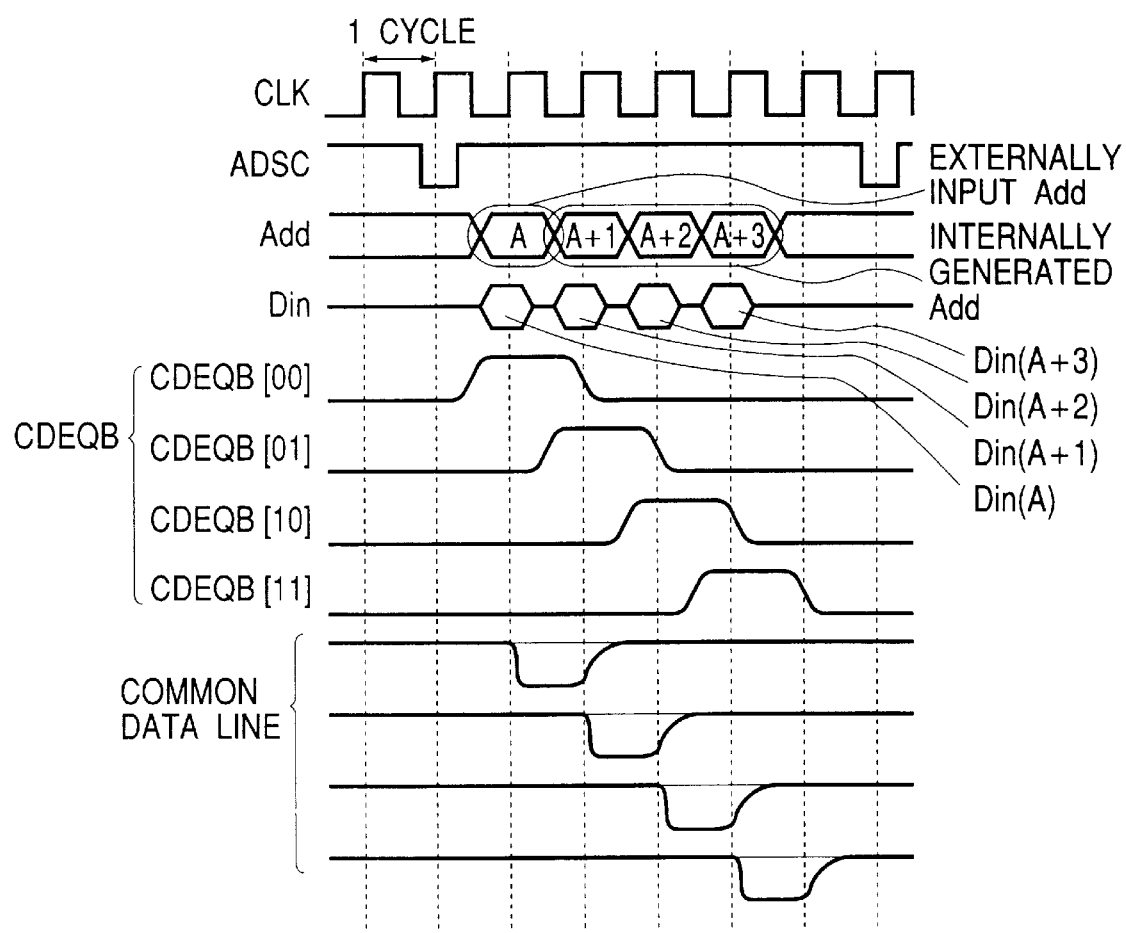
FIG. 9 is a waveform chart illustrating how a write operation is performed.

FIG. 9 depicts waveforms in effect when the burst write mode is selected. The waveform chart of FIG. 9 is also similar to that of FIG. 4 which has already been explained. Thus, what is represented by FIG. 9 will not be described further in detail. In particular, FIG. 9 shows common data line precharging signals and common data line po t ential levels. It will be readily understood from the waveform chart of FIG. 9 that when data is being written to one memory mat, the common data lines corresponding to another memory mat can be precharged. Thus, even if a relatively large parasitic capacity is connected to the common data lines, the precharging of the lines is carried out unfailingly.

The major benefits of the above-described embodiments are as follows: (1) The inventive memory has a plurality of memory mats each i n cluding a plurality of word lines, a plurality of data lines, and a plurality of static memory cells each connected to a word line and a data line. Upon receipt of an address signal into an address register, an address selection circuit selects a memory cell in one of the memory mats, and connects the selected memory cell to a sense amplif ier or a write amplifier corresponding to the memory mat inquestion. Atthe same time, an address counter generates an address signal corresponding to the address signal by which one of the memory mat has been selected. When a burst mode is designated by a control signal, the address signal admitted to the address register is used to select a memory cell in a first memory mat. The selected memory cell is connected to the corresponding sense amplifier or write amplifier. Then, in accordance with the address signal generated by the address counter, a memory cell in another memory mat is selected and connected to the corresponding sense amplifier or write amplifier. In this manner, read and write operations are carried out at high speed. (2) The address signal and control signal are admitted in synchronism with an input clock signal. A memory cell selecting operation and a data I/O operation are carried out successively in synchronism with the clock signal. Because one operation is performed over two clock cycles (i.e., on a pipeline basis), consecutive read andwrite operations are made possible in synchronism with the clock signal. (3) The address signal fed to the address selection circuit is generated by adding up two address signals, i.e., the address signal input to the address register, and the address signal generated by the address counter. Depending on whether the address counter is allowed to operate, either a burst operation or a one-shot memory access operation is executed selectively. This feature helps simplify the circuit constitution.

Although the description above contains many specificities, these should not be construed as limiting the scope of the invention, but as merely providing illustrations of the presently preferred embodiments of this invention. Thus, it is to be understood that changes and variations may be made without departing from the spirit or scope of the claims that follow. For example, where the burst mode is switched from one memory mat to another, the Y address of the memory mat currently in effect may be selected in synchronism with the word line selecting operation. The number of memory mats is determined in keeping with the burst length; and so it is thus possible to furnish illustratively four or more memory mats as described above. That is, the number of bits making up the address counter is made to reflect the burst length so that the address counter will generate an internal address signal corresponding to the burst operation. In such a case, the main word line need not be used to select one word line corresponding to four memory mats as shown in FIG. 1. Instead, the address selection circuit need only be designed so as to generate address signals consecutively to select the corresponding memory mats. This invention may be applied extensively to static RAMs wherein data is input and output in synchronism with a clock signal.

In the above embodiments, the word lines are separated for each of the memory mats. Alternatively, one word line may be shared by a plurality or all of the memory mats configured. For example, the embodiment of FIG. 1 may have the word lines W0 through W3 replaced by the main word line. In such an alternative case, selecting the main word line means selecting memory cells in each of the memory mats. However, as long as the common data line and sense amplifier and/or write amplifier are provided for each memory mat on a one-for-one basis, the potential of the common data line for one memory mat will not be affected by data coming from another memory mat regardless of whether any column switches are selected in an overlapping manner between the memory mats. This makes it possible to speed up the timings of sense amplifier operations. It should be noted that the alternative setup above can consume large amounts of power because a plurality of memory mats are activated in a virtually simultaneous fashion. In this case, each common data line must correspond to one memory mat on a one-for-one basis and must be isolated electrically from the common data lines provided for the other memory mats.

To sum up, there is provided according to the invention a static RAM having a memory array comprising a plurality of memory mats each including a plurality of word lines, a plurality of data lines, and a plurality of static memory cells formed in a matrix pattern at points of intersection between the word lines and data lines. Upon receipt of an address signal into an address register, an address selection circuit selects a memory cell in one of the memory mats constituting the memory array, and connects the selected memory cell to a sense amplifier or a write amplifier corresponding to the memory mat in question. At the same time, an address counter generates an address signal corresponding to the addresssignal bywhich oneof thememorymats has beenselected. When a burst mode is designated bya control signal, the address signal admitted to the address register is used to select a memory cell in a first memory mat. The selected memory cell is connected to the corresponding sense amplifier or write amplifier. Then, in accordance with the address signal generated by the address counter, a memory cell in another memory mat is selected and connected to the corresponding sense amplifier or write amplifier. In this manner, high-speed read and write operations are carried out.

What is claimed is:

1. A static semiconductor memory comprising:
    a first memory mat having a plurality of word lines, a plurality of complementary data lines, and a plurality of static memory cells each connected to a word line and a complementary data line;
    a second memory mat having a plurality of word lines, a plurality of complementary data lines, and a plurality of static memory cells each connected to a word line and a complementary data line;
    a first common data line pair;
    a second common data line pair isolated electrically from said first common data line pair;
    a first selection circuit for selectively connecting a complementary data line of said first memory mat to said first common data line pair;
    a second selection circuit for selectively connecting a complementary data line of said second memorymat to said second common data line pair;
    a first precharging circuit for precharging said first common data line pair;
    a second precharging circuit for precharging said second common data line pair;
    a first sense circuit connected to said first common data line pair; and
    a second sense circuit connected to said second common data line pair.

2. A static semiconductor memory according to claim 1, further comprising:
    a first write circuit connected to said first common data line pair; and
    a second write circuit connected to said second common data line pair.

3. A static semiconductor memory according to claim 1, further comprising:
    a bus supplied continuously with an output of said first asense circuit and an output of said second sense circuit; and
    an output circuit for outputting signals of said bus.

4. A static semiconductor memory according to claim 3, further comprising:
    a first write circuit connected to said first common data line pair; and
    a second write circuit connected to said second common data line pair.

5. A static semiconductor memory according to claim 4, further comprising:
    a write bus connected to said first write circuit and to said second write circuit; and
    an input circuit for continuously placing write data onto said write bus.

6. A static semiconductor memory according to claim 1, further comprising:
    a first word line selection circuit for selecting a word line of said first memory mat; and
    a second word line selection circuit for selecting a word line of said second memory mat.

7. A static semiconductor memory comprising:
    a memory array made of a plurality of memory mats each including a plurality of static memory cells formed in a matrix pattern at points of intersection between a plurality of word lines and a plurality of complementary data lines;
    an address counter for generating an address signal corresponding to an address signal by which to select a specific memory mat of said memory array;
    an address register for admitting an input address signal;
    an address selection circuit for receiving the address signal admitted into said address register in order to select one of the memory mats constituting said memory array;
    a plurality of sense amplifiers which are furnished corresponding to said plurality of memory mats and which receive read signals from the selected memory cells;
    a plurality of write amplifiers which are furnished corresponding to said plurality of memory mats and which supply write signals to the selected memory cells;
    an output circuit common to said plurality of sense amplifiers;
    an input circuit common to said plurality of write amplifiers; and
    a control circuit for judging an operation mode based on a control signal supplied through an external terminal and for generating control signals for use in the judged mode;
    wherein said address selection circuit selects a memory cell in a first memory mat by use of the address signal admitted into said address register and connects the selected memory cell to either the corresponding sense amplifier or the corresponding write amplifier when a burst mode is designated by an externally supplied control signal, and wherein memory cells in the remaining memory mats are selected consecutively in accordance with the address signal generated by said address counter so that each selected memory cell is connected successively to either the sense amplifier or the write amplifier corresponding to the cell.

8. A static semiconductor memory according to claim 7, wherein the address and control signals are admitted in synchronism with an input clock signal, and wherein the selection of memory cells and input/output operations of data are carried out in synchronism with said clock signal.

9. A static semiconductor memory according to claim 7, wherein the address signal by which to select a memory mat is part of the address signal for selecting a word line of a memory mat.

10. A static semiconductor memory according to claim 7, wherein the address signal fed to said address selection circuit is acquired by adding up the address signal admitted into said address register and the address signal generated by said address counter.

* * * * *